United States Patent [19]

Ohkoshi et al.

[11] Patent Number: 5,045,974

[45] Date of Patent: Sep. 3, 1991

[54] DISPLAY TUBE ASSEMBLY AND MOUNTING PROCESS THEREOF

[75] Inventors: Akio Ohkoshi, Tokyo; Hideaki Nakagawa, Kanagawa; Koji Tsuruta; Hiroshi Kato, both of Kanagawa, all of Japan

[73] Assignee: Sony Corporation, Tokyo, Japan

[21] Appl. No.: 573,793

[22] Filed: Aug. 28, 1990

[30] Foreign Application Priority Data

Aug. 28, 1989 [JP] Japan .................................. 1-221022

[51] Int. Cl.[5] .......................... H05K 7/00; H04N 5/64

[52] U.S. Cl. .................................... 361/399; 361/380; 361/395; 361/404; 358/254; 340/717; 340/815.23

[58] Field of Search ............... 361/331, 380, 395, 399, 361/400, 404, 405; 455/347; 358/254; 312/7.2; 340/717, 815.23

[56] References Cited

U.S. PATENT DOCUMENTS

| | | | |
|---|---|---|---|
| 3,005,049 | 10/1961 | Yoder ................................ | 358/254 |
| 3,944,892 | 3/1976 | Johnson et al. .................... | 358/254 |
| 4,682,239 | 7/1987 | Watanabe . | |
| 4,727,284 | 2/1988 | Ohkoshi et al. . | |

*Primary Examiner*—Leo P. Picard
*Assistant Examiner*—Michael W. Phillips
*Attorney, Agent, or Firm*—Hill, Van Santen, Steadman & Simpson

[57] ABSTRACT

A display tube assembly is provided, in which plug pins are mounted on a printed circuit board, this printed circuit board having the plug pins soldered thereto is attached to a display tube and the display tube is accommodated in a case thereby being made watertight. According to this arrangement, the plug pins, the printed circuit board and the display tube are coupled together in the outside of the case so that a working property in the assembly process can be improved considerably. Further, since a window portion is not provided at the rear surface of the case, the reliability in the watertight process in the display tube can be improved considerably.

4 Claims, 6 Drawing Sheets

DISPLAY TUBE ASSEMBLY AND MOUNTING PROCESS THEREOF

BACKGROUND OF THE INVENTION

1. Field of the Invention

The present invention generally relates to display apparatus and, more particularly, is directed to a display tube assembly for such display apparatus and mounting process thereof in which the assembly process can be improved considerably and a reliability in the water-tightness process in the display tube can be improved considerably.

2. Description of the Prior Art

The assignee of the present application has previously proposed a display apparatus in which a number of display cells are arranged in a two-dimensional manner and these display cells are driven by predetermined data thereby displaying a desired video image (see U.S. Pat. No. 4,682,239 and U.S. Pat. No. 4,727,284 (corresponding to European Laid-Open Patent Gazette No. 0149550)).

Furthermore, the assignee of the present application has previously proposed a fluorescent display tube which is suitably applied to a display cell used in such display apparatus (see U.S. Pat. No. 4,727,284).

This luminescent display tube which was mentioned above is illustrated in FIG. 1, which is a front view; FIG. 2, which is a side view and FIG. 3, which is a perspective view. The drawings have been partially cutaway in some instances and illustrate a luminescent display tube for use as a unitary cell.

As illustrated, a glass housing 11 is composed of a front panel 11A, a back panel 11B, and a side wall plate 11C. The glass housing 11 is shaped to have the dimensions of, for example, 41 mm in height and 86 mm in width on the front panel 11A. In the glass housing 11, there are arrayed eight luminescent trios 12 (12*a*, 12*b*, 12*c*, 12*d*, 12*e*, 12*f*, 12*g* and 12*h*) which function as luminescent display components which are composed of phosphor layers that serve as picture elements and eight electrode units 13 (13*a*, 13*b*, 13*c*, 13*d*, 13*e*, 13*f*, 13*g* and 13*h*) corresponding to the luminescent trios 12.

The eight luminescent trios 12 are formed by coating phosphor layers on the inner surface of the front panel 11A in a manner such that four trios are arrayed in each of upper and lower rows. In a particular example, each of the luminescent trios 12 is composed of three phosphor layers 14R, 14G and 14B which respectively emit red, green, and blue light. In the configuration illustrated in FIG. 1, a conductive carbon layer 15 is printed in the shape of a frame on the inner surface of the front panel 11A; and the red phosphor layer 14R, green phosphor layer 14G and blue phosphor layer 14B are printed to correspond to individual blank areas in the frame and partially override or overlap the carbon layer 15. A metal backing layer of aluminum or the like is deposited through a film layer on the phosphor layers.

The electrode units 13 are disposed in the proximity of the rear panel 11B at positions opposite to the luminescent trios 12, respectively. In each of the electrode units 13, there are arrayed three cathode wires K ($K_R$, $K_G$ and $K_B$) which are mounted opposite to the red phosphor layer 14R, the green phosphor layer 14G and the blue phosphor layer 14B of the luminescent trio 12, respectively; and three first grids $G_1$ ($G_{1R}$, $G_{1G}$ and $G_{1B}$) are mounted opposite to the three wire cathodes K respectively; and an additional common second grid $G_2$ is mounted in opposing relationship to the three first grids $G_1$.

Then the second grids $G_2$ of the four electrode units 13*a* through 13*d* mounted in one horizontal row are connected to each other and the second grids $G_2$ of the four electrode units 13*e* through 13*h* mounted in another row are connected to each other in a similar manner. Also, the first grids $G_1$ are mutually connected between every two electrode units arrayed in a vertical column such as between 13*a* and 13*e*, between 13*b* and 13*f*, between 13*c* and 13*g*, and between 13*d* and 13*h*, respectively. Thus, with respect to the two electrode units mounted in a vertical column, the first grids $G_{1R}$ at the respective centers are mutually connected and similarly the first grids $G_{1B}$ and $G_{1G}$ at the right ends are mutually connected together and also the first grids $G_{1G}$ and $G_{1B}$ at the left ends are mutually connected together. In this particular example, the cathodes K are connected in series with each other.

The respective ends of the wire cathodes K, and first and second grids $G_1$ and $G_2$, identified as 67$G_1$, are led out through a sealed region between the rear panel 11B and the bottom end face of the side wall plate 11C.

There are shown further leads 61F of the wire cathodes which are connected between the electrode units 13*a* to 13*d*; leads 62F of the wire cathodes which are connected between the electrode units 13*e* to 13*h*; leads 63$G_2$ of the second grids $G_2$ which are connected between the electrode units 13*a* through 13*h*; leads 64$G_1$ of the three first grids $G_1$ mutually connected between the electrode units 13*a* and 13*e*; leads 65$G_1$ of the three first grids $G_1$ mutually connected between the electrode units 13*b* and 13*f*; leads 66$G_1$ of the three first grids $G_1$ mutually connected between the electrode units 13*c* and 13*g*; and leads 67$G_1$ of the three first grids $G_1$ mutually connected between the electrode units 13*d* and 13*h*.

A separator assembly 40 is formed of a conductive material and is positioned so as to surround the respective phosphor layers 14R, 14G and 14B of each of the eight luminescent trios 12. The separator assembly 40 functions in one aspect as a so-called diffusion lens to expand electron beams so that the electron beams may properly impinge upon the whole area of the corresponding phosphor layers. The separator assembly 40 also functions as a power supply device to supply an anode voltage from the anode lead 46 to the respective luminescent trios 12. The anode lead 46 to which the high voltage is applied is connected at one end thereof to the electrode plate 42 of the separator assembly 40 and is also led out to the outside at the other end thereof through a tip off tube 47 attached to the rear panel 11B of the glass housing 11. The anode lead 46 is composed of a Dumet wire (Cu alloy) wound with glass in its portion adjacent to the tip off tube 47, thus making the anode lead 46 and the tip off tube 47 airtight.

An anode voltage of, for example, about 8 kV is supplied through the anode lead 46 and the separator assembly 40 to the respective red, green and blue phosphor layers 14R, 14G, and 14B of each of the luminescent trios 12. The first grids $G_1$ are supplied with a voltage of lower than, for example, 0 V (OFF) to 5 V (ON), and the second grids $G_2$ are supplied with a fixed voltage of lower than, for example, 10 V. Further, the wire cathode K is supplied with a voltage of lower than, for example, 0 V to 5 V as a row selecting voltage.

Accordingly, under the condition that, for example, 0 V is applied to the wire cathodes K of the electrode units 13*a* to 13*d* of the upper row and, for example, a cutoff voltage 5 V is applied to the wire cathodes K of the electrode units 13*e* to 13*h* of the lower row, if a voltage of 5 V is applied through the lead $64G_1$ to the first grids $G_1$, then the first luminescent trio 12*a* will be rendered luminous. When a voltage of 0 V is applied to the first grids $G_1$, then the electron beam is cut off so that the corresponding phosphor layer is not rendered luminous.

If a voltage is sequentially supplied to the first grids $G_1$ through the leads $64G_1$, $65G_1$, $66G_1$, and $67G_1$, the luminescent trios 12*a* to 12*d* of the upper row will be rendered luminous. Then, if 0 V is applied to the wire cathodes K and the voltage 5 V is similarly applied to the first grids $G_1$ through the leads $64G_1$ to $67G_1$, in that order, the luminescent trios 12*e* to 12*h* of the lower row will be rendered luminous. That is, the phosphor layers of respective colors, namely, luminescent segments 14 are selectively turned ON and OFF by the voltages supplied to the wire cathodes K and the first grids $G_1$.

The display apparatus is formed by arranging a number of the above-mentioned display tubes in a two-dimensional fashion. In such display tube, different display signals are supplied to the fluorescent segments at every frame, resulting in the displays being in accordance with the respective display signals. The display in each luminescent segment is carried out at the unit of ON and OFF display operation so that, when the signal of the ON period is pulse width modulated (PWM), brightness modulation is carried out.

The display apparatus using the above-mentioned display tubes is generally located outdoors so that each display tube must be made watertight. In that case, a display tube assembly including the above display tube is employed in the prior art as shown in FIG. 4.

FIG. 4 is an exploded, perspective view of a display tube assembly, and which illustrates the display cell from the rear side thereof.

In FIG. 4, reference numeral 100 designates a display tube, 200 a printed circuit board, and 300 a case. A plug pin 400 is construced to protrude outwardly from the inside of the case 300 for supplying a signal. Further, in FIG. 4, reference numeral 500 designates a plug cover and 600 a louver.

During the assembly, the printed circuit board 200 is inserted into the case 300 and the other ends of the plug pin 400 protruding to the inside of the case 300 are connected through connection holes 201 formed through the printed circuit board 200 at the corresponding positions and are soldered with the connection holes 201 or the like.

Then, the display tube 100 is accommodated within the case 300 and the leads 101 such as the above-mentioned leads 61F and the like are connected to connection portions 202 of the printed circuit board 200. The connection portions 202 are connected to the connection holes 201 via a conductive pattern (not shown) on the printed circuit board 200. The connection portions 202 and the leads 101 are connected (i.e., soldered) through a window portion 301 formed on the rear side of the case 300. At the completion of the above-described connection, the window portion 301 is covered with the plug cover 500 and the louver 600 is attached to the front wall of the display tube 100.

FIG. 5 is a process diagram of the above-mentioned assembly process.

As shown in FIG. 5, the display tube 100, the printed circuit board (i.e., PCB) 200, the case 300 having the plug pins 400 embedded therein, the plug cover 500 and the louver 600 are prepared. Initially, the printed circuit board 200 is inserted into the case 300 and soldered therein. In the next process, the display tube 100 is accommodated in the case 300 and soldered therein. Then, the plug cover 500 and the louver 600 are attached to the case 300 and bonded thereto by silicon resin or the like thereby making the display cell watertight.

FIG. 6 is a side view of a section of the above-mentioned display cell, and to which reference will be made in explaining the assembly-process at its step in which the display tube 100 is accommodated in the case 300. In this step, as shown in FIG. 6, the printed circuit board (i.e., PCB) 200 and the plug pins 400 are soldered together and the display tube 100 is accommodated in the case 300. After the leads 101 and the connection portions 202 are connected together, the plug cover 500 and the louver 600 are attached to the case 300 and the spacings therebetween are made watertight.

In this display tube assembly, the soldering-process between the plug pins 400 and the connection portions 201 and the soldering-process between the leads 101 and the connection portions 202 are performed via the inside of the case 300 or the window portion 301. That is, the soldering-process is carried out in a relatively small spacing, which needs high accuracy in the assembly work. Therefore, the prior-art assembly work is carried out in a so-called manual fashion.

On the other hand, since the window portion 301 is provided at the rear surface of the case 300, the required watertight area is increased, and the increase of the watertight area can cause the watertight structure to be decreased in reliability. Particularly, if the window portion 301 is made small, the ability to undertake the soldering-process or the like will be deteriorated considerably, while if the window portion 301 is made large, reliability of the watertight structure will be further decreased.

OBJECTS AND SUMMARY OF THE INVENTION

Accordingly, it is an object of the present invention to provide an improved display tube assembly and mounting process thereof which can eliminate the aforenoted shortcomings and disadvantages of the prior art.

More specifically, it is an object of the present invention to provide a display tube assembly and mounting process thereof in which a working property in the assembly process of the display apparatus can be improved considerably.

It is another object of the present invention to provide a display tube assembly and mounting process thereof in which watertightness of the display tube can be improved considerably.

As an aspect of the present invention, a display tube assembly is provided, in which plug pins are mounted on a printed circuit board, soldered thereto this printed circuit board having the plug pins being attached to a display tube and accommodated in a case made watertight. According to this arrangement, the plug pins, the printed circuit board and the display tube are coupled together outside of the case so that a working property in the assembly process can be improved considerably. Further, since a window portion is not provided at the rear surface of the case unlike the prior art, a reliability in the watertight process in the display tube can be improved considerably.

The above and other objects, features and advantages of the present invention will be apparent in the following detailed description of the preferred embodiment when read in conjunction with the accompanying drawings, in which like reference numerals are used to identify the same or similar parts in the several views.

DETAILED DESCRIPTION OF THE PREFERRED EMBODIMENT

An embodiment of a display tube assembly and mounting process thereof according to the present invention will hereinafter be described with reference to the drawings.

Figure 1:
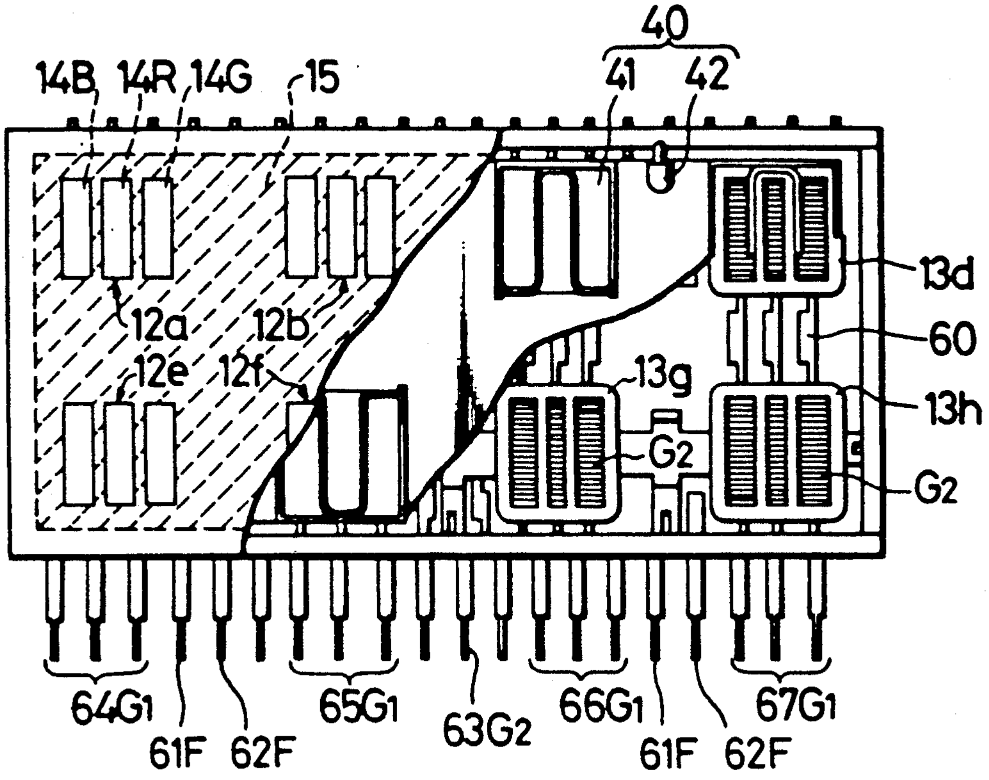
FIG. 1 (PRIOR ART)
FIG. 1 is a partially cutaway plan view illustrating an example of a prior-art display element having eight three color units therein.
Figure 2:
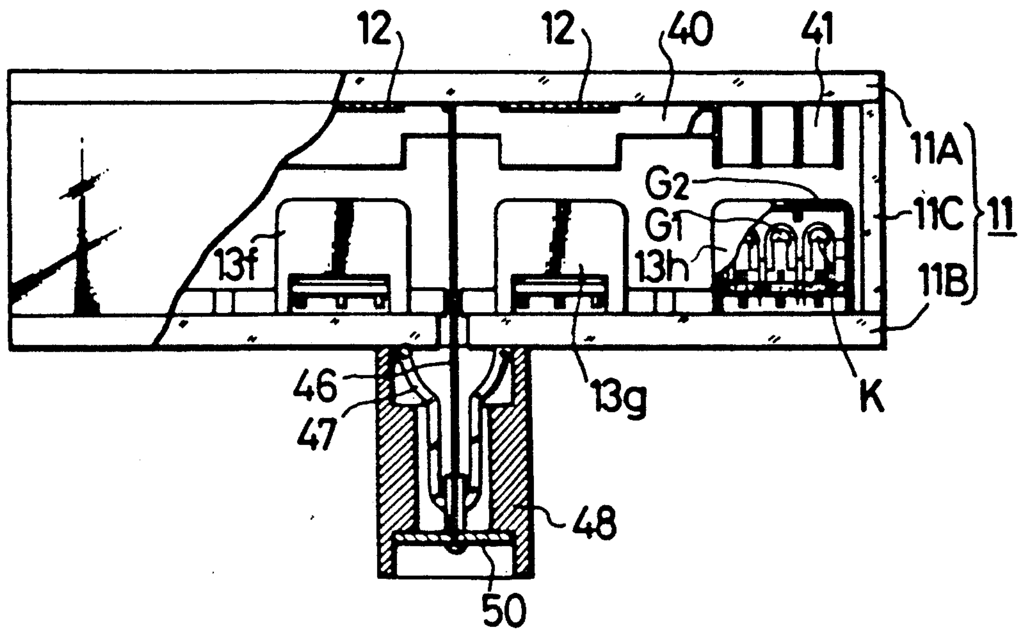
FIG. 2 (PRIOR ART)
FIG. 2 is a partially cutaway sectional view illustrating the display unit of FIG. 1.
Figure 3:
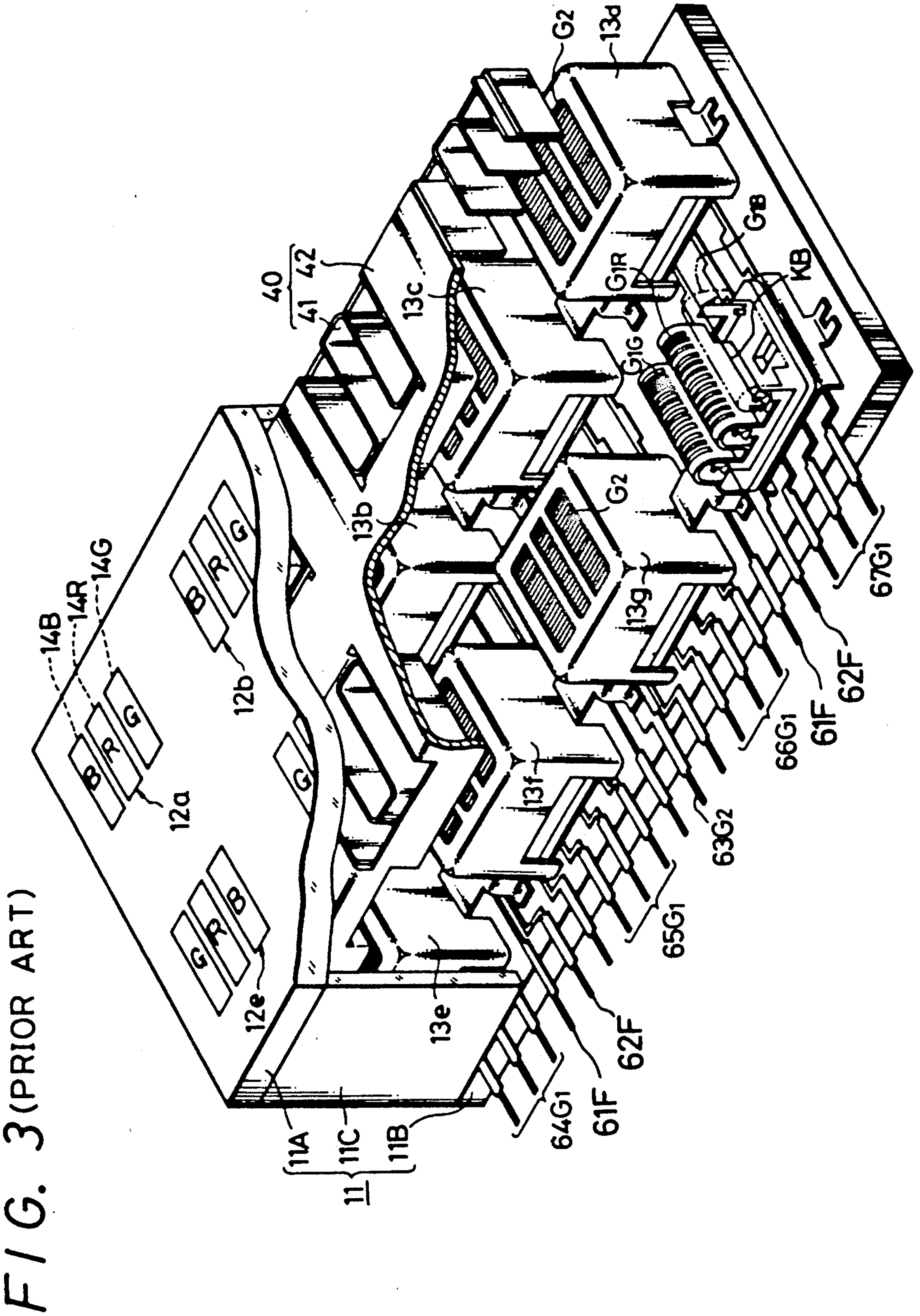
FIG. 3 (PRIOR ART)
FIG. 3 is a partially cutaway perspective view of the prior-art display apparatus.
Figure 4:
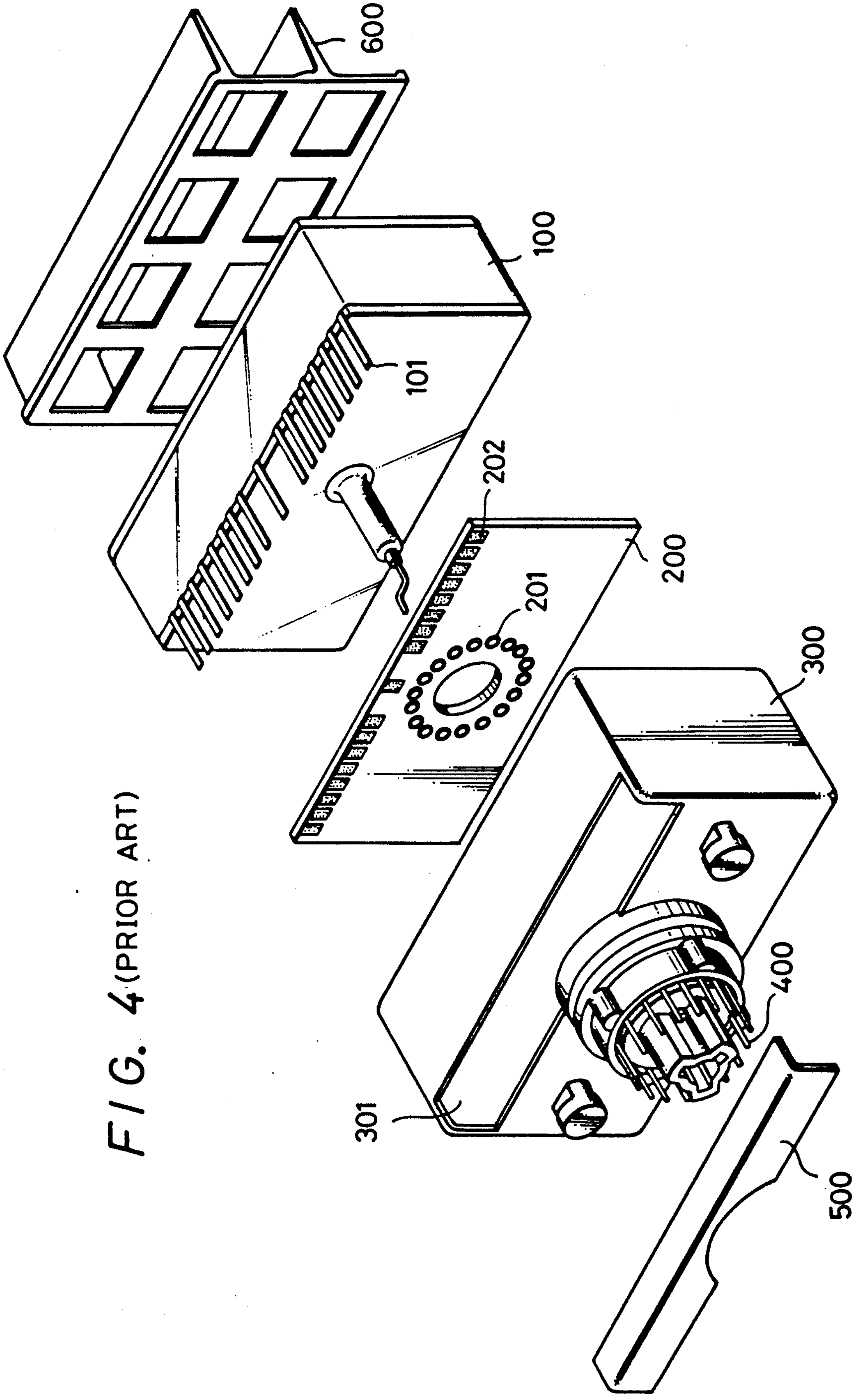
FIG. 4 (PRIOR ART)
FIG. 4 is an exploded perspective view to which reference will be made in explaining a display tube assembly of the prior-art display apparatus.
Figure 5:
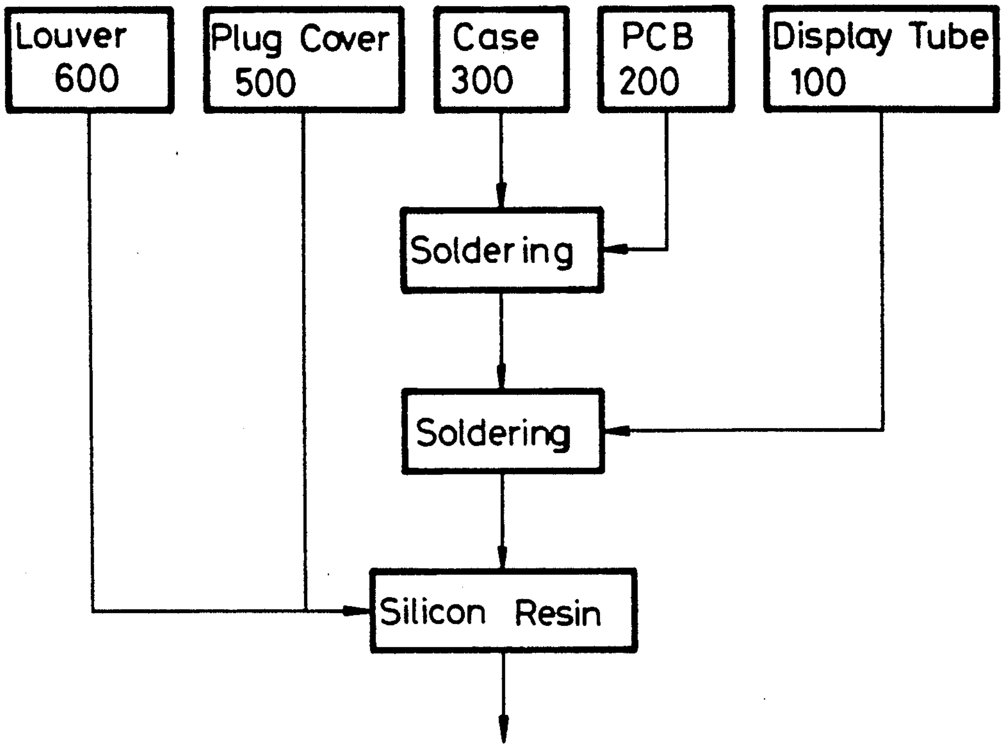
FIG. 5 (PRIOR ART)
FIG. 5 is a process diagram of the assembly process according to the prior art.
Figure 6:
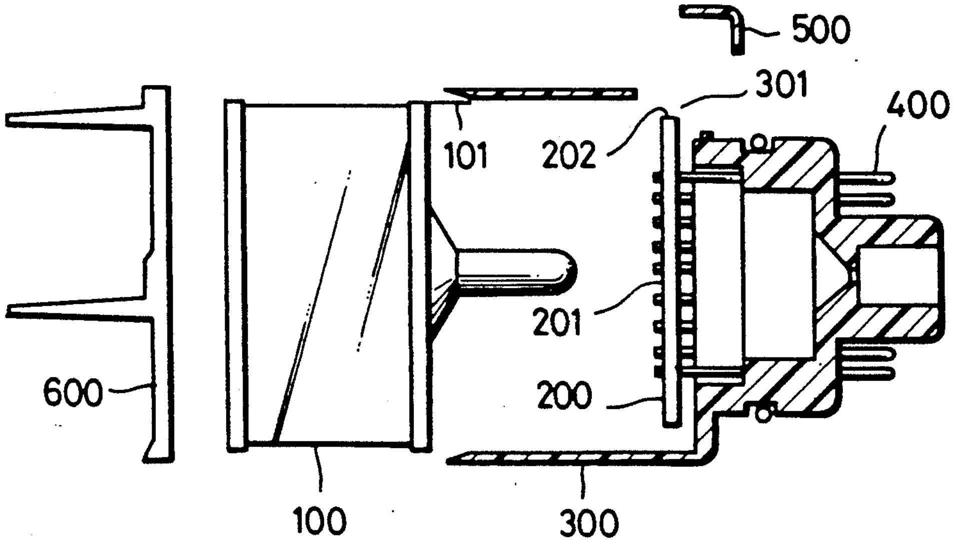
FIG. 6 (PRIOR ART)
FIG. 6 is a side view in partial section of the prior-art display tube assembly, and to which reference will be made in explaining a particular step in which step a display tube is accommodated in a case.
Figure 7:
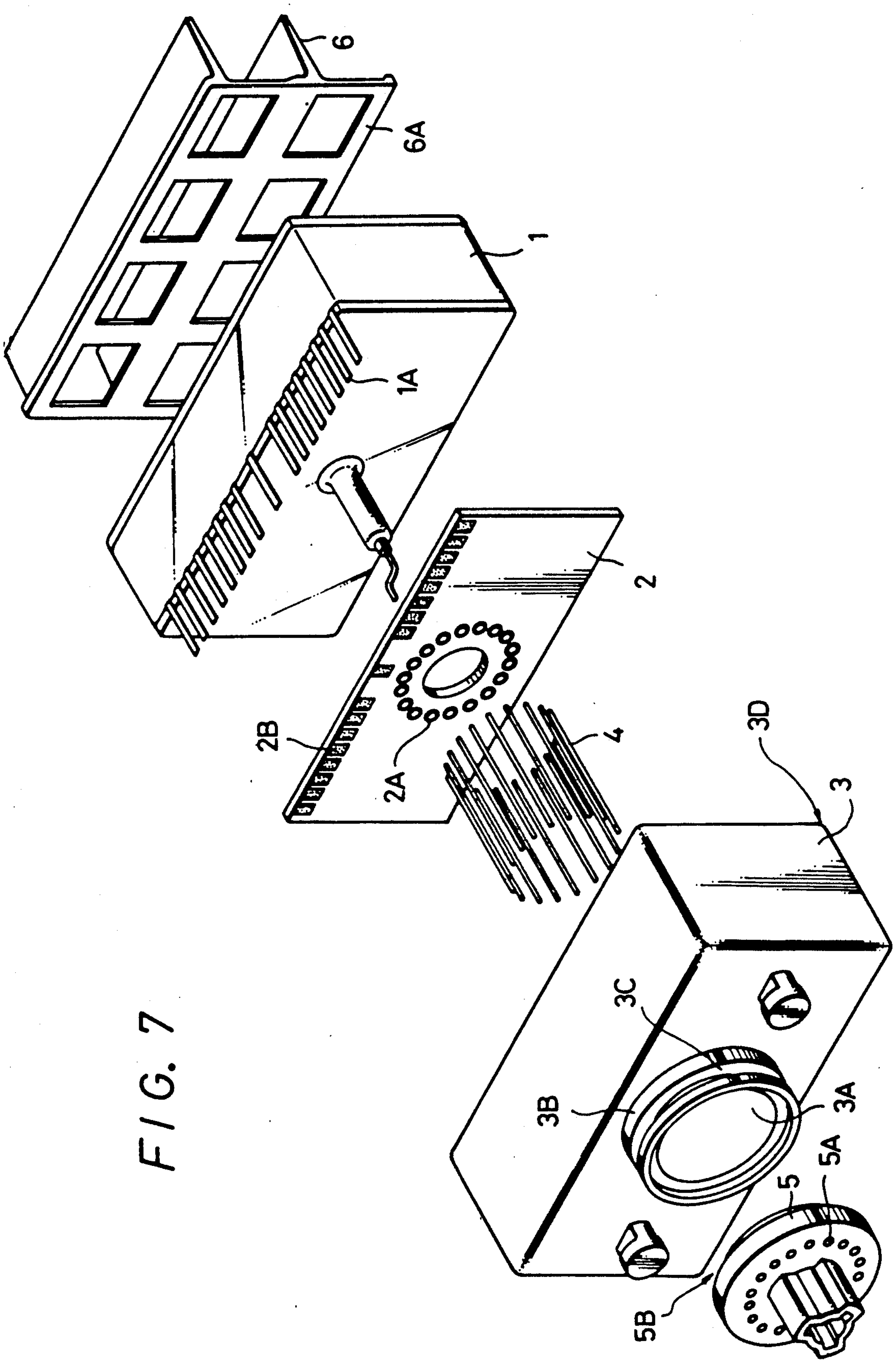
FIG. 7 is an exploded perspective view illustrating an embodiment of a display tube assembly according to the present invention.

FIG. 7 is an exploded perspective view illustrating the display element of the present invention from the rear side thereof. In FIG. 7, reference numeral 1 designates a display tube, 2 a printed circuit board, 3 a case, 4 a plug pin, 5 a plug cover and 6 a louver, respectively.

As shown in FIG. 7, in the assembly-process, the plug pins 4 are inserted into connection holes 2A of the printed circuit board 2, respectively and soldered therein. Then, the printed circuit board 2 is attached to the display tube 1, and leads 1A such as the aforementioned lead 61F or the like and connection portions 2B of the printed circuit board 2 are soldered together. The connection portions 2B are respectively connected to the connection holes 2A via a conductive pattern (not shown) on the printed circuit board 2.

The unitarily-connected body of the printed circuit board 2, the plug pins 4 and the display tube 1 is accommodated in the case 3. On the rear surface of the case 3, there is mounted a plug base portion 3B having an opening portion 3A into which the plug pins 4 soldered to the printed circuit board 2 are inserted. The plug pins 4 are protruded toward the rear surface of the case 3 via the above-mentioned opening 3A.

The plug cover 5 is mounted on the protruding plug pins 4. The plug cover 5 has a configuration communicated with the plug base portion 3B of the case 3 and has formed therethrough at its positions corresponding to the plug pins 4 insertion holes 5A. Thus, when the plug cover 5 is mounted on the plug pins 4, the plug pins 4 are properly positioned.

The louver 6 is attached on the front wall of the display tube 1.

Figure 8:
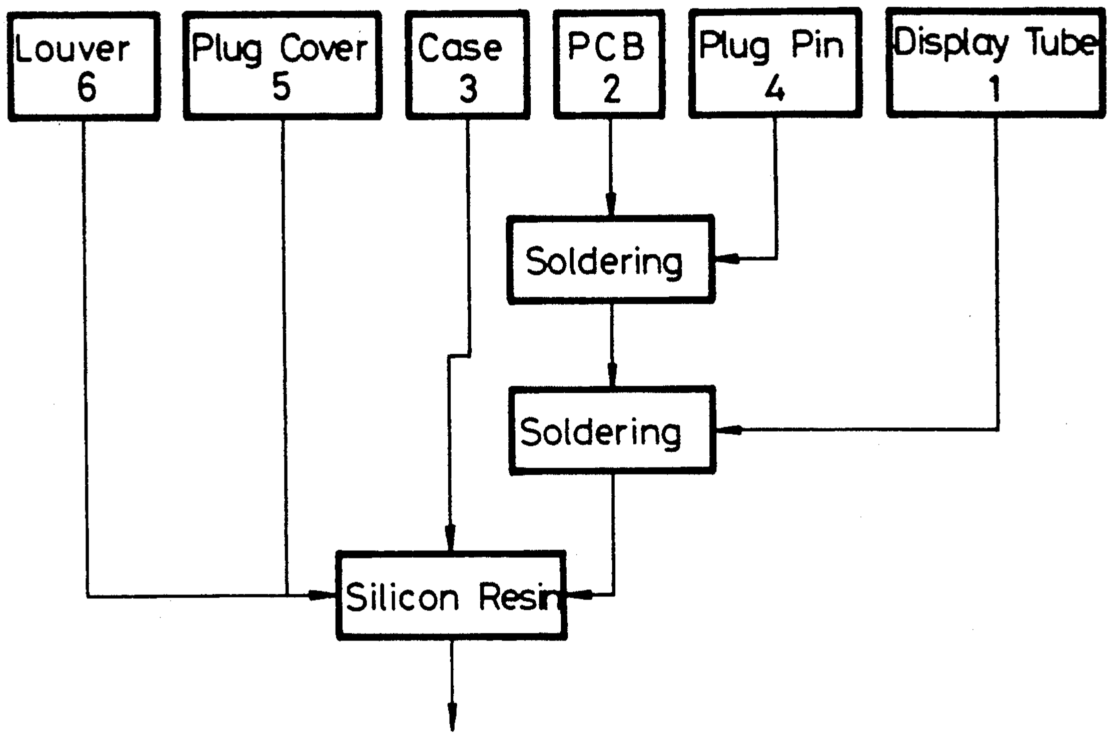
FIG. 8 is a process diagram showing the assembly work of the present invention, and to which reference will be made in explaining the mounting process of the present invention.

FIG. 8 is a process diagram of the assembly process of the display tube assembly of the present invention.

As shown in FIG. 8, the display tube 1, the printed circuit board (PCB) 2, the case 3, the plug pins 4, the plug cover 5 and the louver 6 are prepared, and the plug pins 4 and the printed circuit board 2 are soldered together initially. Then, the printed circuit board 2 and the display tube 1 are soldered together. In the last process, the unitarily-connected body of the printed circuit board 2, the plug pins 4 and the display tube 1 is accommodated in the case 3 and the plug cover 5 and the louver 6 are attached to the case 3. The spacings therebetween are bonded by a silicon resin or the like, whereby the display tube assembly of the present invention is made watertight.

Figure 9:
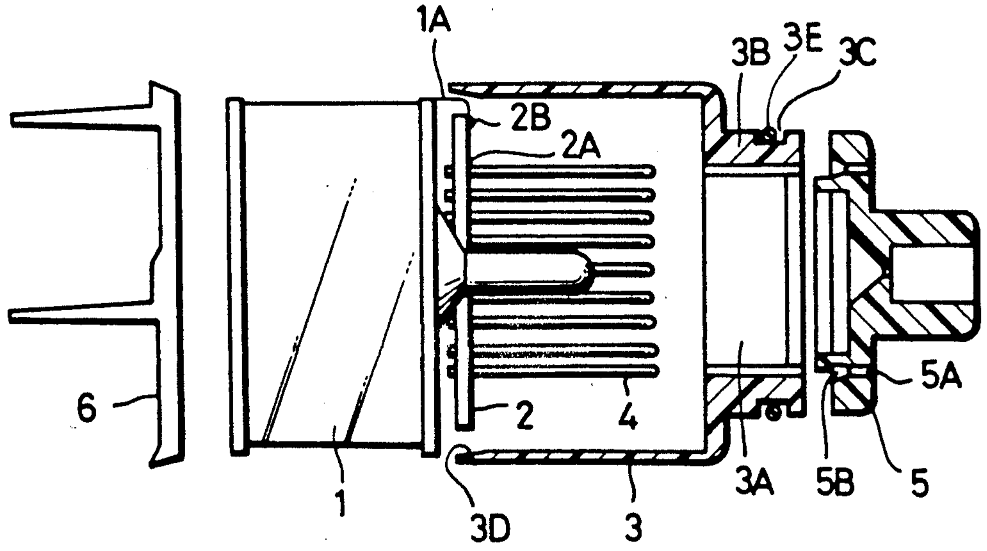
FIG. 9 is a side view in partial section of the display tube assembly of the present invention, and to which reference will be made in explaining a particular step in which the display tube of the present invention is accommodated in the case.

FIG. 9 is a side view of a section of the display tube assembly of the present invention, and to which reference will be made in explaining the mounting process of the display tube assembly of the present invention, inter alia, a step in which the display tube 1 is accommodated in the case 3.

As shown in FIG. 9, the printed circuit board 2, the plug pins 4 and the display tube 1 are coupled together and the unitarily-connected body of the printed circuit board 2, the plug pins 4 and the display tube 1 is accommodated in the case 3. The plug cover 5 and the louver 6 are attached to the case 3 and the spacings therebetween are made watertight.

According to the display tube assembly of the present invention, since the plug pins, the printed circuit board and the display tube are coupled together in the outside of the case, the working property in the assembly process of the invention can be considerably improved. Further, since the window portion is not provided at the rear side of the case unlike the prior art, the reliability in the waterproofing-treatment can be increased considerably.

In the above-described arrangement, the plug cover 5 and the plug base portion 3B are separated at the rear side of a groove 3C at which an O ring is provided in order to make a spacing between a rear unit and a socket of the unit side watertight when the display element is mounted to the rear unit. Therefore, the separated surface of the plug cover 5 is located at the rear side of the watertight surface provided by the O ring 3E, thus to make it possible to increase the reliability in the watertightness thereof.

When the display tube 1 is accommodated in the case 3, the end portion of the front wall of the case 3 is protruded from the display surface of the display tube 1 by a very small amount and a predetermined stepped portion 3D is provided at the inside of this protruded portion. Also, the outer periphery of the base portion 6A of the louver 6 is engaged with the stepped portion 3D. Thus, under the condition that the display tube 1 is accommodated in the case 3, if the silicon resin is injected into the stepped portion 3D and the outer periphery of the base portion 6A of the louver 6 is engaged with the stepped portion 3D, it is possible to realize the watertight-process of high reliability with great ease.

Further, a so-called V-shaped groove 5B is formed on the plug cover 5 at its surface opposing to the plug base portion 3B so as to connect the end portions of the insertion holes 5A. Thus, when the plug cover 5 is mounted on the plug base portion 3B, the plug pins 4 are guided by the V-shaped groove 5B, whereby the plug cover 5 can be mounted on the plug base portion 3B or the case 3 with great ease.

In the above-mentioned arrangement, the plug cover 5 and the case 3 may be unitarily formed with each other.

According to the present invention, as set out above, since the plug pins, the printed circuit board and the display tube are coupled together in the outside of the case, the working property in the assembly process can be improved considerably. Further, since the window portion is not formed at the rear surface of the case unlike the prior art, the reliability of the watertight process can be improved considerably.

Having described a preferred embodiment with reference to the accompanying drawings, it is to be understood that the invention is not limited to that precise embodiment and that various changes and modifications thereof could be effected by one skilled in the art without departing from the spirit or scope of the invention as defined in the appended claims.

We claims as our invention:

1. A method of assemblying a display tube assembly comprising:

- a display tube having a plurality of leads;
- a corresponding plurality of plug pins respectively connected to said plurality of leads;
- a printed circuit board mounted on said display tube; and
- a case covering said display tube and said printed circuit board with said plug pins protruding outwardly, from said case characterized in that said display tube assembly is assembled by the following steps:
- a first step of mounting said plug pins on said printed circuit board;
- a second step of mounting said printed circuit board on said display tube with said plug pins connected through corresponding conductive patterns to said leads of said display tube;
- a third step of putting said display tube in said case with said plug pins protruding outwardly through an opening thereof; and
- a fourth step of making said case watertight.

2. The method of assemblying a display tube assembly according to claim 1, wherein said third step includes a step for making said plug pins protrude outwardly through a plurality of holes in a plug cover provided on said case.

3. A mounting process of a display tube assembly comprising:

- a first step of mounting plug pins on a printed circuit board;
- a second step of mounting said printed circuit board on a display tube with said plug pins connected to corresponding conductive pattern connected to leads of said display tube;
- a third step of putting said display tube in a case with said plug pins protruding outwardly through an opening thereof; and
- a fourth step of making said case watertight so as to accommodate said display tube, said printed circuit board, and said plurality of plug pins by covering same with sealing material.

4. The mounting process of a display tube assembly according to claim 3, wherein said third step includes a step of making said plug pins protrude outwardly through a plurality of holes in a plug cover on the opening of said case.

* * * * *